United States Patent
You et al.

(10) Patent No.: US 8,780,940 B2
(45) Date of Patent: Jul. 15, 2014

(54) METHOD AND APPARATUS FOR COMPRESSING FRAME

(75) Inventors: Sung-Jin You, Daejeon (KR);
Gwangzeen Ko, Seoul (KR);
Moon-Won Lee, Daejeon (KR);
Jung-Sun Um, Gyeonggi-do (KR);
Myung-Sun Song, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 118 days.

(21) Appl. No.: 13/140,167

(22) PCT Filed: Aug. 6, 2009

(86) PCT No.: PCT/KR2009/004395
§ 371 (c)(1),
(2), (4) Date: Jun. 16, 2011

(87) PCT Pub. No.: WO2010/074385
PCT Pub. Date: Jul. 1, 2010

(65) Prior Publication Data
US 2012/0002683 A1 Jan. 5, 2012

(30) Foreign Application Priority Data
Dec. 22, 2008 (KR) .................. 10 2008 0131181

(51) Int. Cl.
*H04J 3/18* (2006.01)
*H04B 7/216* (2006.01)
*H04B 7/185* (2006.01)

(52) U.S. Cl.
USPC ............ 370/477; 370/318; 370/342; 455/522

(58) Field of Classification Search
USPC .......................... 370/329–332, 342–474, 318;
348/441–459; 382/232–248;
455/70–226, 450–522
See application file for complete search history.

(56) References Cited

U.S. PATENT DOCUMENTS

| | | | | |
|---|---|---|---|---|
| 5,579,316 A * | 11/1996 | Venters et al. | ................ | 370/392 |
| 6,674,480 B2 * | 1/2004 | Nakazawa | .................... | 348/459 |
| 7,289,045 B1 * | 10/2007 | Walls et al. | ..................... | 341/50 |
| 7,589,648 B1 * | 9/2009 | Ma et al. | ......................... | 341/87 |
| 7,831,127 B2 * | 11/2010 | Wilkinson | .................... | 370/406 |
| 8,315,192 B2 * | 11/2012 | Agiwal et al. | ................. | 370/310 |
| 2002/0141652 A1 * | 10/2002 | Charrier et al. | ............... | 382/248 |
| 2003/0081838 A1 * | 5/2003 | Teng | .............................. | 382/232 |
| 2004/0022252 A1 * | 2/2004 | Jang et al. | ................ | 370/395.52 |
| 2010/0220639 A1 * | 9/2010 | Sugaya | ......................... | 370/310 |

FOREIGN PATENT DOCUMENTS

| | | |
|---|---|---|
| JP | 2004-343567 | 12/2004 |
| KR | 10-2008-0012441 | 2/2008 |
| KR | 10-2008-0090250 | 10/2008 |

OTHER PUBLICATIONS

International Search Report for PCT/KR2009/004395, Mailed Jun. 9, 2010.

* cited by examiner

*Primary Examiner* — Man Phan
(74) *Attorney, Agent, or Firm* — Staas & Halsey LLP

(57) ABSTRACT

Provided is a method and apparatus for efficiently transmitting and receiving a frame including a header and a payload in a communication system. If the number of repeated items in the content of a header of the frame is high, specific preambles are allocated to the repeated items and the repeated items are omitted. Accordingly, data transfer efficiency can be improved.

13 Claims, 5 Drawing Sheets

METHOD AND APPARATUS FOR COMPRESSING FRAME

CROSS REFERENCE TO RELATED APPLICATIONS

This application is a national phase application, under 35 U.S.C. 371, of international application No. PCT/KR2009/004395, filed on Aug. 6, 2009, which claimed priority to Korean Patent Application No. 10-2008-0131181, filed on Dec. 22, 2008, the disclosures of which are incorporated herein by reference.

TECHNICAL FIELD

The present invention relates to a method and apparatus for compressing a frame, and more particularly, to a method and apparatus for efficiently transmitting and receiving a frame consisting of a header and a payload in a communication system.

BACKGROUND ART

Frame transmission over a network has been an important aspect of computer technology for a long time. Communications protocols used to transmit frames have been developed for many networks.

Using a conventional communications protocol, a user initializes access to a server and requests the server for data.

Whether a wired distributed network or a wireless distributed network is used, digital data is transmitted in frames.

While some protocols require a frame to have a fixed size, other protocols require a frame to have a variable size.

Since a data transmission capacity of a network using a frame having a fixed size is limited, as the length of a header is increased, the amount of data carried by the payload is reduced.

In order to improve data transfer efficiency and satisfy increasing demand for digital information, communications service providers always try to transmit more data through a pipeline having the same bandwidth.

DISCLOSURE OF INVENTION

Technical Problem

As an attempt to improve data transfer efficiency, a method of compressing a frame is suggested.

In the method, a server compresses a frame and transmits the compressed frame to a user, and the user decompresses the compressed frame.

All of the frame may be compressed, or part of the frame, for example, a header or a payload of the frame, may be compressed.

The header of the frame includes information about a transmitter and a receiver and governs overall communications.

Although real-time data, such as audio or video information, may be compressed by the method of compressing the frame and then transmitted and received, a transmission delay may occur between the transmitter and the receiver, thereby causing distortion that cannot be allowed in real-time data.

The method of compressing the frame header has a drawback in that if an error occurs in the transmitter, information about the error should be transmitted from the receiver to the transmitter.

In the case of an error, the transmitter may re-transmit lost or distorted data, or must update the error information at the header and transmit the updated information to the receiver.

Technical Solution

The present invention provides a method and apparatus for compressing a frame in order to increase a data transfer rate in data communications.

Advantageous Effects

As described above, the method and apparatus for compressing the frame according to the present invention can improve data transfer efficiency, for example, in video streaming, by omitting repeated items, which are not changed for a predetermined period of time, from header information.

DESCRIPTION OF DRAWINGS

The above and other features and advantages of the present invention will become more apparent by describing in detail exemplary embodiments thereof with reference to the attached drawings in which.

BEST MODE

Figure 1:
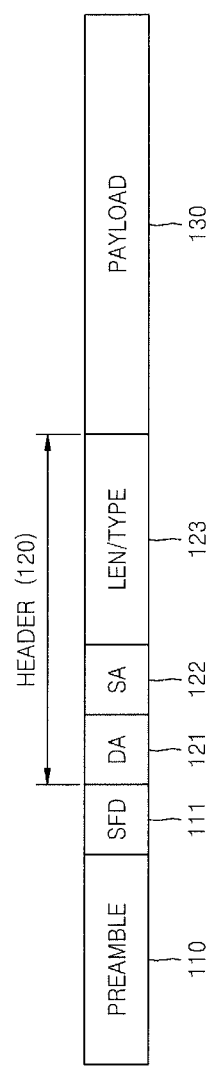
FIG. 1 illustrates a conventional frame.

According to an aspect of the present invention, there is provided a method of compressing a frame, the method comprising: performing an initialization process by extracting repeated items from header information of a frame to be transmitted and generating specific preambles mapped to the repeated items; generating a compressed header by omitting the repeated items from the header information; and transmitting a frame comprising the specific preambles and the compressed header.

The method may further comprise transmitting the specific preambles.

In the initialization process, the repeated items may comprise at least one selected from the group consisting of a destination address (DA), a source address (SA), a length, and a type of the frame to be transmitted.

The DA, the SA, and the length/type may be some representative examples of many parameters included a header.

In the initialization process, the specific preambles may vary according to the repeated items, and different specific preambles may be orthogonal to each other.

According to another aspect of the present invention, there is provided an apparatus for compressing a frame, the apparatus comprising: a header analyzing unit extracting repeated items from header information of a frame to be transmitted; a specific preamble generating unit generating specific preambles mapped to the repeated items; a header generating unit generating a compressed header by omitting the repeated items from the header information; and a frame generating unit generating a frame comprising the specific preambles and the compressed header.

The apparatus may further comprise a payload generating unit mapping a data stream, which is to be transmitted, to a payload.

The repeated items may comprise at least one selected from the group consisting of a DA, an SA, a length, and a type of the frame to be transmitted.

The DA, the SA, and the length/type may be some representative examples of many parameters included a header.

The specific preambles generated by the specific preamble generating unit may vary according to the repeated items, and different specific preambles may be orthogonal to each other.

The apparatus may further comprise a transmitting unit transmitting the specific preambles generated by the specific preamble generating unit.

According to another aspect of the present invention, there is provided an apparatus for compressing a frame, the apparatus comprising: a transmitting unit generating and transmitting a frame comprising a compressed header, which is obtained by omitting repeated items from header information, and specific preambles mapped to the repeated items; and a receiving unit receiving the frame, and transmitting a specific preamble-compressed header mapping response message.

The receiving unit may map the specific preambles to the repeated items.

The apparatus may further comprise a control unit retrieving the specific preambles after the frame and the specific preamble-compressed header mapping response message are communicated between the transmitting unit and the receiving unit.

The specific preambles may vary according to the repeated items, and different specific preambles may be orthogonal to each other.

The repeated items may comprise at least one selected from the group consisting of a destination address, a source address, a length, and a type of the frame.

MODE FOR INVENTION

The present invention will now be described more fully with reference to the accompanying drawings showing exemplary embodiments that could have been easily implemented by one of ordinary skill in the art.

The present invention provides a method and apparatus for compressing a frame, wherein if there are many repeated items in the content of a header, specific preambles are allocated to omit the repeated items, thereby improving data transfer efficiency.

For example, in video streaming, if header information is not changed for a predetermined period of time, data transfer efficiency can be improved by omitting repeated items in the header information.

FIG. 1 illustrates a conventional frame.

The conventional frame used in a network includes a preamble 110, a header 120, and a payload 130.

The preamble 110 precedes the header 120 and synchronizes frames.

If the conventional frame is used for the Ethernet, the preamble 110 is a 56-bit sequence of alternating 1 and 0 bits, like 101010..., and synchronizes a transmitter and a receiver.

If the conventional frame is used for wireless communication, the preamble 110 estimates the timing of a first symbol using continuously transmitted signals.

A start frame delimiter (SFD) 111 marks the start of the header 120 and the end of the preamble 110, and is an 8-bit (1-byte) sequence, that is, 10101011.

The SFD 111 is an 8-bit (1-byte) sequence informed to the header 120 and the payload 130 has a byte unit and synchronizes frames.

The header 120 includes a destination address (DA) 121, a source address (SA), and a len/type 123.

In the len/type 123, len is an abbreviation of length that refers to a maximum size carryable in one frame, and type indicates a protocol to which encapsulated data belongs.

The DA 121, the SA, and the len/type 123 of FIG. 1 are some representative examples of many parameters included in the header 120.

Figure 2:
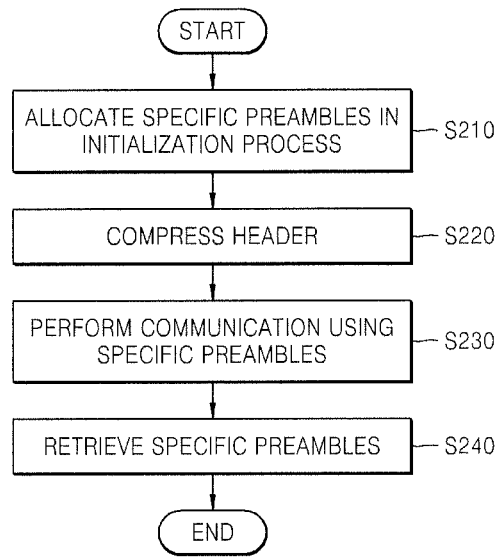
FIG. 2 is a flowchart illustrating a method of compressing a frame, according to an embodiment of the present invention.

FIG. 2 is a flowchart illustrating a method of compressing a frame, according to an embodiment of the present invention.

If a transmitter determines that header information of a frame to be transmitted is not changed for a predetermined period of time, the transmitter extracts repeated items from the header information and generates specific preambles corresponding to the repeated items.

That is, in an initialization process of the method, the transmitter extracts the repeated items from the header information, and generates the specific preambles mapped to the repeated items.

The transmitter transmits the repeated items and the specific preambles to a receiver, and shares information about the repeated items and the specific preambles with the receiver.

After the initialization process of sharing the information about the repeated items and the specific preambles between the transmitter and the receiver in operation S210, the method proceeds to operation S220. In operation S220, the transmitter omits the repeated items to obtain a compressed header. In operation S230, a frame including the specific preambles, a payload, and the compressed header that is obtained after omitting the repeated items, is transmitted.

The specific preambles refer to preambles that can be allocated dynamically.

That is, the specific preambles refer to preambles that can be allocated and retrieved if necessary according to the type of a device or a stream.

The specific preambles may be selected from a set including two or more preambles, or determined in a random manner.

The specific preambles may be determined in such a manner as to be highly orthogonal to each other.

Once the specific preambles are allocated, the repeated items may be omitted.

For example, a header of a video stream may include a source address, a destination address, and a header type.

If all of the header information is not changed for a predetermined period of time, the header information may be omitted entirely.

However, if some items of the header information are repeated for a predetermined period of time, only the repeated items are omitted in order to improve data transfer efficiency.

In operation S240, the generated specific preambles are retrieved after communication using the specific preambles ends.

If there are no repeated items in the header information or the items are repeated for a very short period of time, a general preamble as shown in FIG. 1 is allocated and communication is performed by using the general preamble.

The general preamble may be allocated dynamically in a similar way to the specific preambles, or the general preamble may have a fixed value and be allocated.

The method of FIG. 2 may be applied to an 802.16 system and increase a data transfer rate by allocating the specific preambles according to a connection identification (CID).

Figure 3:
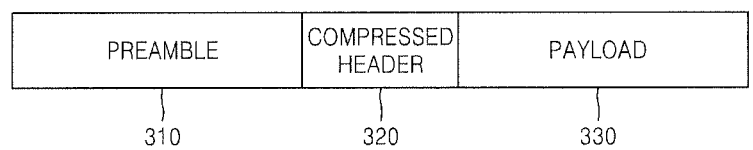
FIG. 3 illustrates a frame generated by the method of FIG. 2, according to an embodiment of the present invention.

FIG. 3 illustrates a frame generated by the method of FIG. 2, according to an embodiment of the present invention.

The length of the frame, which is obtained after omitting the repeated items from the header information, illustrated in FIG. 3 is less than the length of the frame illustrated in FIG. 1.

Figure 4:
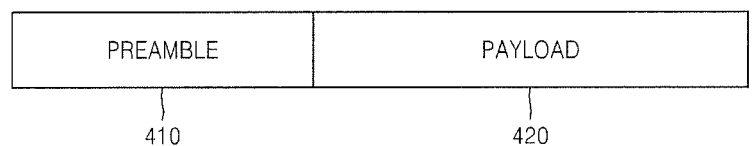
FIG. 4 illustrates a frame generated by the method of FIG. 2, according to another embodiment of the present invention.

FIG. 4 illustrates a frame generated by the method of FIG. 2, according to another embodiment of the present invention.

If all of the header information is not changed, all of the header information may be omitted.

However, the specific preambles when all of the header information is omitted as shown in FIG. 4 are different from the specific preambles when only the repeated items of the header information are omitted as shown in FIG. 3.

For example, in video streaming, if the header information is not changed for a predetermined period of time, the method of FIG. 2 may be used to improve data transfer efficiency by allocating a preamble according to a video stream.

Figure 5:
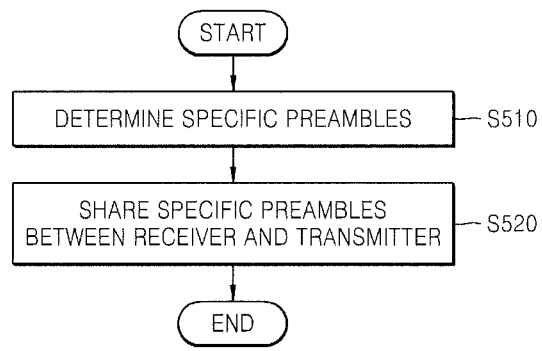
FIG. 5 illustrates an initialization process of the method of FIG. 2, according to an embodiment of the present invention.

FIG. 5 illustrates an initialization process of the method of FIG. 2, according to an embodiment of the present invention.

In operation S510, the transmitter extracts repeated items from header information, and generates specific preambles mapped to the repeated items.

In operation S520, the transmitter transmits the repeated items and the specific preambles to the receiver, and shares information about the repeated items and the specific preambles with the receiver.

Figure 6:
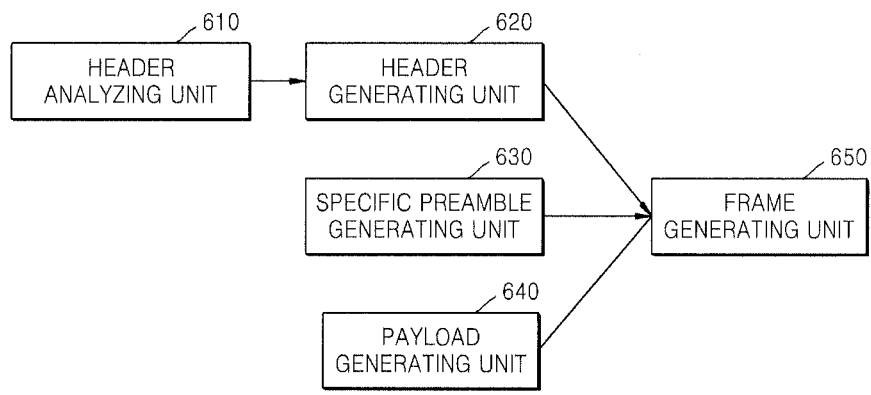
FIG. 6 illustrates an apparatus for compressing a frame, according to an embodiment of the present invention.

FIG. 6 illustrates an apparatus for compressing a frame, according to an embodiment of the present invention.

Referring to FIG. 6, the apparatus includes a header analyzing unit 610, a header extracting unit 620, a specific preamble generating unit 630, a payload generating unit 640, and a frame generating unit 650.

The header analyzing unit 610 analyzes whether repeated items exist in header information of a frame to be transmitted.

The header generating unit 620 generates a compressed header by omitting the repeated items from the header information.

The specific preamble generating unit 630 generates specific preambles mapped to the repeated items.

The payload generating unit 640 maps a video data stream, which is to be transmitted to a receiver, to a payload.

The frame generating unit 650 generates a frame including the compressed header, which is obtained by omitting the repeated items from the header information, the specific preambles, and the payload, and transmits the frame to the receiver.

Figure 7:
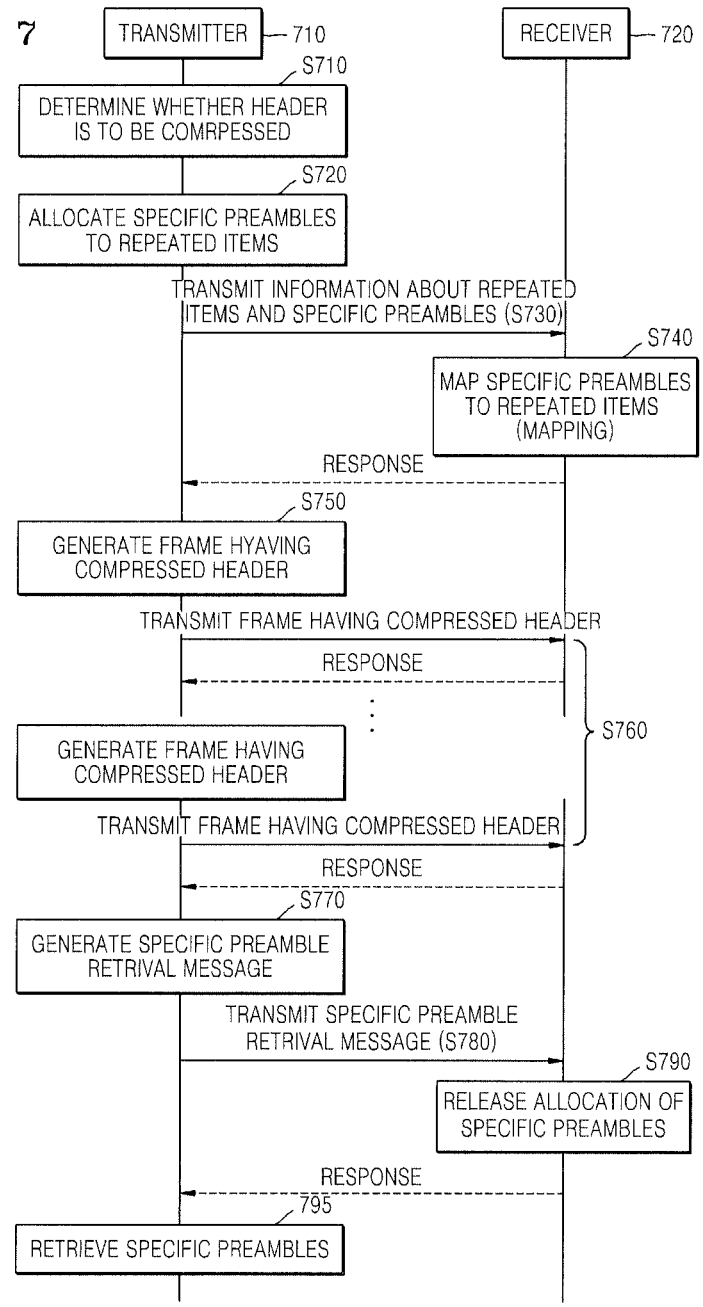
FIG. 7 illustrates a method of communicating data between a transmitter and a receiver, according to an embodiment of the present invention.

FIG. 7 illustrates a method of communicating data between a transmitter and a receiver, according to an embodiment of the present invention.

In operation S710, a transmitter 710 determines whether a header is to be compressed or not before transmitting a frame.

If it is determined in operation S710 that the header is to be compressed, the method proceeds to operation S720. In operation S720, the transmitter 710 allocates specific preambles to the repeated items.

In operation S730, the transmitter 710 transmits information about repeated items, which are omitted from header information, and the specific preambles to a receiver 720.

In operation S740, the receiver 720 maps the specific preambles to the repeated items based on the information received by the receiving unit 720.

In operation S750, the transmitter 710 receives a repeated item-specific preamble mapping response message from the receiver 720, and generates a frame having a compressed header.

In operation S760, the transmitter 710 transmits the frame including the specific preambles and the compressed header to the receiver 720.

If the communication between the transmitter 710 and the receiver 720 ends, the method proceeds to operation S780. In operation S780, the transmitter 710 transmits a specific preamble retrieval message to the receiver 720.

In operation S790, the receiver 720 releases the allocation of the specific preambles.

In operation S795, the transmitter 710 retrieves the specific preambles and allows the specific preambles to be used by another transmitter.

Figure 8:
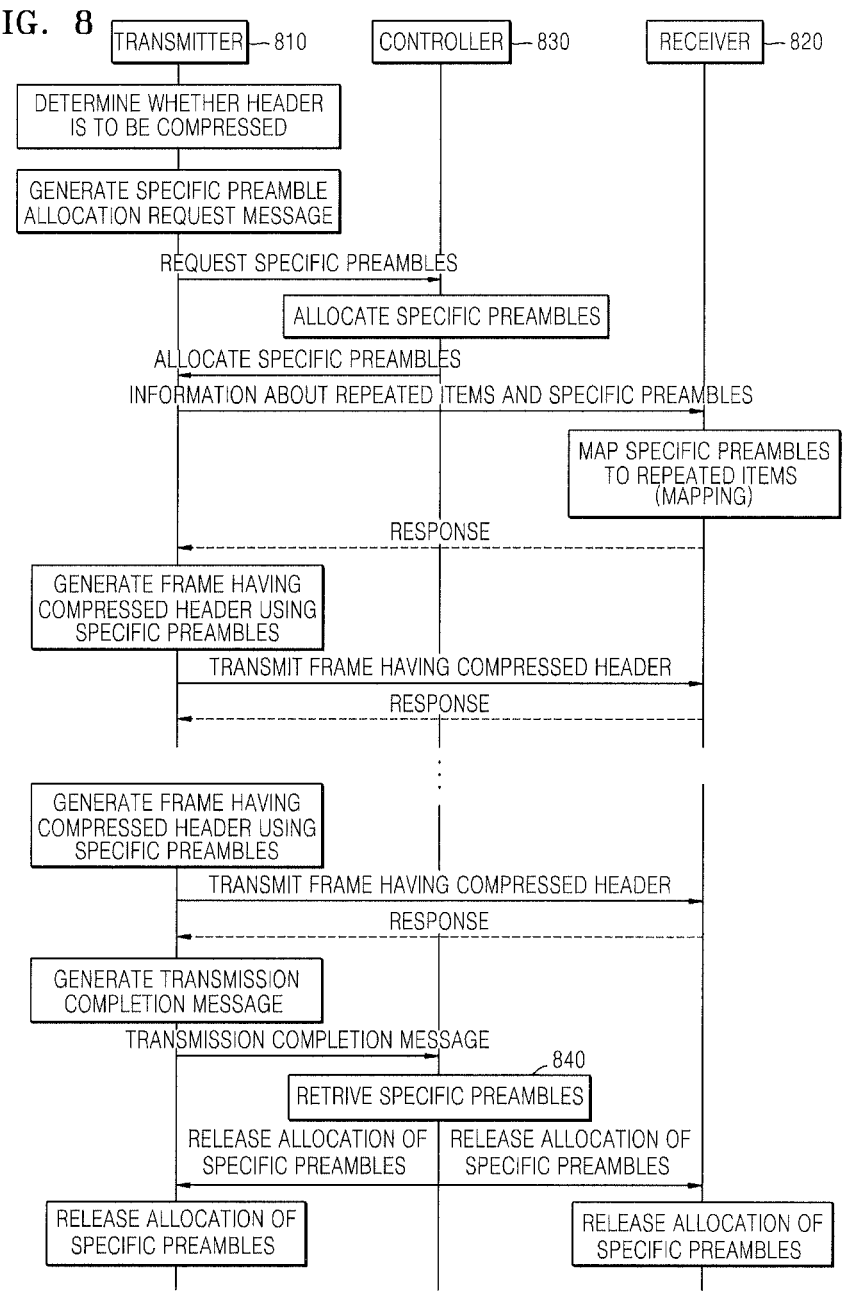
FIG. 8 illustrates a method of communicating data between a transmitter, a receiver, and a controller, according to an embodiment of the present invention.

FIG. 8 illustrates a method of communicating data between a transmitter, a receiver, and a controller, according to an embodiment of the present invention.

The method of FIG. 8 is performed in a similar manner to the method of FIG. 7 except that in operation 840, a control unit 830 allocates and retrieves specific preambles.

As described above, the method and apparatus for compressing the frame according to the present invention can improve data transfer efficiency, for example, in video streaming, by omitting repeated items, which are not changed for a predetermined period of time, from header information.

While the present invention has been particularly shown and described with reference to exemplary embodiments thereof using specific terms, the embodiments and terms have been used to explain the present invention and should not be construed as limiting the scope of the present invention as defined by the claims. The preferred embodiments should be considered in a descriptive sense only and not for purposes of limitation. Therefore, the scope of the invention is defined not by the detailed description of the invention but by the appended claims, and all differences within the scope will be construed as being included in the present invention.

The invention claimed is:

1. A method of compressing a frame, the method comprising:
   monitoring header information of transmitted frames for a predetermined period of time;
   after the monitoring,
   when there are no repeated items in the header information of the frames transmitted during the predetermined period of time, transmitting a successive frame with all of the header information;
   when some items in the header information of the transmitted frames are repeated during the predetermined period of time, generating specific preambles mapped to the repeated items, generating a compressed header by omitting the repeated items from the header information, and transmitting a successive frame comprising the specific preambles and the compressed header; and
   when all items in the header information of the transmitted frames are repeated during the predetermined period of time, transmitting a successive frame without any header information.

2. The method of claim 1, further comprising transmitting the specific preambles.

3. The method of claim 1, wherein the repeated items comprise any one of a destination address, a source address, a length, and a type of the frame to be transmitted.

4. The method of claim 1, wherein the specific preambles vary according to the repeated items, and different specific preambles are orthogonal to each other.

5. An apparatus for compressing a frame, the apparatus comprising:
- a header analyzing unit monitoring header information of transmitted frames for a predetermined period of time and extracting repeated items from the header information;
- a specific preamble generating unit generating specific preambles mapped to the repeated items when some items in the header information of the transmitted frames are repeated during the predetermined period of time;
- a header generating unit generating a compressed header by omitting the repeated items from the header information; and
- a frame generating unit generating a successive frame, the successive frame being a frame with all of the header information when there are no repeated items in the header information of the frames transmitted during the predetermined period of time, a frame comprising the specific preambles and the compressed header when some items in the header information of the transmitted frames are repeated during the predetermined period of time, and a frame without any header information when all items in the header information of the transmitted frames are repeated during the predetermined period of time.

6. The apparatus of claim 5, further comprising a payload generating unit mapping a data stream, which is to be transmitted, to a payload.

7. The apparatus of claim 5, wherein the repeated items comprise any one of a destination address, a source address, a length, and a type of the frame to be transmitted.

8. The apparatus of claim 5, wherein the specific preambles generated by the specific preamble generating unit vary according to the repeated items, and different specific preambles are orthogonal to each other.

9. The apparatus of claim 5, further comprising a transmitting unit transmitting the specific preambles generated by the specific preamble generating unit.

10. An apparatus for compressing a frame, the apparatus comprising:
- a transmitter generating and transmitting a frame comprising a compressed header, which is obtained by omitting repeated items from header information, and specific preambles mapped to the repeated items; and
- a receiver receiving the frame, and transmitting a specific preamble-compressed header mapping response message,
- wherein the specific preambles vary according to the repeated items, and different specific preambles are orthogonal to each other.

11. The apparatus of claim 10, wherein the receiving unit maps the specific preambles to the repeated items.

12. The apparatus of claim 10, further comprising a control unit retrieving the specific preambles after the frame and the specific preamble-compressed header mapping response message are communicated between the transmitting unit and the receiving unit.

13. The apparatus of claim 10, wherein the repeated items comprise at least one selected from the group consisting of a destination address, a source address, a length, and a type of the frame.

* * * * *